(12) United States Patent
Hehn (10) Patent No.: US 10,812,227 B2
(45) Date of Patent: Oct. 20, 2020

(54) METHOD FOR TRANSFERRING DATA VIA A DISRUPTED RADIO CHANNEL AND RECEIVING UNIT AND TRANSMITTING UNIT FOR USE IN THE METHOD

(71) Applicant: VOLKSWAGEN AKTIENGESELLSCHAFT, Wolfsburg (DE)

(72) Inventor: Thorsten Hehn, Wolfsburg (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 104 days.

(21) Appl. No.: 16/082,369

(22) PCT Filed: Jan. 11, 2017

(86) PCT No.: PCT/EP2017/050468
§ 371 (c)(1),
(2) Date: Sep. 5, 2018

(87) PCT Pub. No.: WO2017/153066
PCT Pub. Date: Sep. 14, 2017

(65) Prior Publication Data
US 2019/0068332 A1  Feb. 28, 2019

(30) Foreign Application Priority Data

Mar. 11, 2016 (DE) .......... 10 2016 204 039
Jun. 14, 2016 (DE) .......... 10 2016 210 492

(51) Int. Cl.
*H04L 1/18* (2006.01)
*H04L 1/00* (2006.01)
*H03M 13/25* (2006.01)

(52) U.S. Cl.
CPC ........ *H04L 1/1819* (2013.01); *H03M 13/258* (2013.01); *H04L 1/00* (2013.01);
(Continued)

(58) Field of Classification Search
None
See application file for complete search history.

(56) References Cited

U.S. PATENT DOCUMENTS 7,096,400 B2 * 8/2006 Lim ............... H04L 1/0009
714/748
2005/0149841 A1  7/2005 Kyung et al.
(Continued)

FOREIGN PATENT DOCUMENTS

EP       1168703 A2    1/2002
WO    2014094601 A1    6/2014
(Continued)

OTHER PUBLICATIONS

Chen, H., et al., "A Survey and Tutorial on Low-Complexity Turbo Coding Techniques and a Holistic Hybrid ARQ Design Example," IEEE Communications Surveys & Tutorials (vol. 15, Issue 4, pp. 1546-1566), Date of Publication: Feb. 15, 2013 (Year: 2013).*
(Continued)

*Primary Examiner* — Kyle Vallecillo
*Assistant Examiner* — Jonathan Chang
(74) *Attorney, Agent, or Firm* — Barnes & Thornburg LLP (57) ABSTRACT

Modern mobile communication systems transfer data by error protection measures including the use of a forward error correction code for the channel coding and a HARQ (hybrid automatic repeat request) system for the repeated transfer of incorrect transport blocks in response to the error protection mechanisms failing. When a turbo code is used as an error protection code, two decoders work on the decoding
(Continued)

of the turbo code. Disclosed is an expanded HARQ system wherein the receiving side determines which of the decoders was more greatly challenged in the decoding of the turbo code and reports this to the transmitting side. Instead of uniformly providing more redundancy data to both decoders, more redundancy data are targetedly provided to the more greatly challenged decoder in the expanded HARQ process than in the case of the repetition operation according to the typical HARQ process reducing the latency of the data transfer.

13 Claims, 6 Drawing Sheets

(52) U.S. Cl.
CPC .......... *H04L 1/0054* (2013.01); *H04L 1/0059* (2013.01); *H04L 1/0066* (2013.01); *H04L 1/1864* (2013.01)

(56) References Cited

U.S. PATENT DOCUMENTS

2007/0016838 A1* 1/2007 Mielczarek .......... H04L 1/0013
714/749

2013/0223485 A1* 8/2013 Bai ................. H04L 1/0068
375/219
2016/0095096 A1 3/2016 Liu et al.

FOREIGN PATENT DOCUMENTS

WO 2016018132 A1 2/2016
WO 2016024833 A1 2/2016

OTHER PUBLICATIONS

LTE; Evolved Universal Terrestrial Radio Access (E-UTRA); Multiplexing and channel coding (3GPP TS 36.212 version 13.1.0 Release 13) (Apr. 2016) (Year: 2016).*

Cipriano et al.; Overview of ARQ and HARQ in Beyond 3G Systems; 21st International Symposium on Personal, Indoor and Mobile Radio Communication Workshops; IEEE; 2010.

Search Report for International Patent Application No. PCT/EP2017/050468; dated Apr. 21, 2017.

Law et al.; A Modified Adaptive Hybrid FEC/ARQ Protocol Using Turbo Codes with Incremental Redundancy Transmission; IEEE VTS 50th Vehicular Technology Conference; 1999; pp. 1670-1674.

Search Report for German Patent Application No. 10 2016 210 492.6; dated Oct. 30, 2018.

* cited by examiner

METHOD FOR TRANSFERRING DATA VIA A DISRUPTED RADIO CHANNEL AND RECEIVING UNIT AND TRANSMITTING UNIT FOR USE IN THE METHOD

PRIORITY CLAIM

This patent application is a U.S. National Phase of International Patent Application No. PCT/EP2017/050468, filed 11 Jan. 2017, which claims priority to German Patent Application Nos. 10 2016 204 039.1, filed 11 Mar. 2016, and 10 2016 210 492.6, filed 14 Jun. 2016, the disclosures of which are incorporated herein by reference in their entireties.

SUMMARY

Illustrative embodiments relate to a method for transmitting data via a disrupted radio channel, wherein the data are transmitted with error protection as forward error correction data. Illustrative embodiments also relate to a transceiver unit for use in the disclosed method.

BRIEF DESCRIPTION OF THE DRAWINGS

An exemplary embodiment is shown in the drawings and is explained in detail below with reference to the figures in which.

DETAILED DESCRIPTION

For the scenario of transportation vehicles equipped with radiocommunication modules which communicate directly with one another in public road transport, whether it be for cooperative or autonomous driving, very high reliability is very important for safety-critical applications. Technologies for direct vehicle-to-vehicle communication have already been developed and continue to be developed. Direct transportation vehicle communication via WLAN, here the option according to the WLAN IEEE 802.11p standard, is cited here as an example. In this technology, ad hoc WLAN networks are set up for the communication between the transportation vehicles (communication in the "ad hoc domain").

However, transportation vehicle communication is possible in the mobile radiocommunication network domain also. With this technology, however, the base station must convey the messages from transportation vehicle to transportation vehicle. This is the field in which communication takes place in the "infrastructure domain". Direct transportation vehicle communication is also enabled for the upcoming mobile radiocommunication generation. In LTE, this option is known as LTE-V, in the 5G initiative, this option is called D2D. This is also the domain of transportation vehicle communication addressed by the present disclosure.

Typical communication scenarios are safety scenarios, traffic efficiency scenarios and infotainment. The following scenarios are cited for the safety domain: "cooperative forward collision warning", "pre-crash sensing/warning", "hazardous location warning". In these domains, transportation vehicles exchange information with one another such as position, direction and speed, and also parameters such as size and weight. Further information which is transmitted relates to intention information, such as: transportation vehicle intends to overtake, transportation vehicle turns off left/right, etc., which are relevant to cooperative driving. Sensor data are often transmitted. If a hazardous situation occurs and the driver does not react, the transportation vehicle could brake automatically so that an accident is prevented or the consequences of an unavoidable accident are at least minimized.

In the domain of traffic efficiency, the following are cited: "enhanced route guidance and navigation", "green-light optimal speed advisory" and "V2V merging assistance".

In the infotainment domain, Internet access is in the foreground.

The listing shows that time-critical data transmissions take place, particularly in the safety domain. The reliability of vehicle-to-vehicle communication is therefore of crucial importance.

In mobile radiocommunication, reliability of data transmission means completeness (all transmitted useful data arrive at the receiver) and correctness (the transmitted useful data and the useful data recovered from the received data match one another). For this purpose, different methods are used in the mobile radiocommunication technologies, e.g., frequency diversity, space diversity, appropriate choice of the modulation type and modulation parameters and the channel code to be used, and also the code rate, etc.

The following mobile radiocommunication technologies are currently usable for vehicle-to-vehicle communication: 3GPP-based UMTS, HSPA, LTE and the upcoming 5G standards. LTE-V and 5G D2D are cited for direct transportation vehicle communication. In all these technologies, data symbols are transmitted with error protection data. However, a good compromise needs to be found here between the number of error protection data per symbol and the desired data throughput. The more error protection data that are added, the lower the number of user data that can be transmitted per time unit becomes. For this reason, the hybrid automatic repeat request (HARQ) method is implemented in mobile radiocommunication after the transport blocks which, despite the error protection, could not be recovered, repeated or supplemented. In any event, either redundancy is subsequently provided through simple repetition of the block, or the error protection is successively increased through subsequent provision of previously omitted redundancy.

This means that a data block or, in the parlance of mobile radiocommunication standards, a transport block, is protected, normally with forward error correction (FEC) data. The receiver attempts to decode the transport block using the FEC data. If this does not succeed, the transmitter is requested to transmit additional redundancy, i.e., more error protection data. A new decoding attempt is started with the originally received data and the additional redundancy.

As mentioned above, the HARQ process is a central element for ensuring the required reliability in data transmission. It is installed on the transmitter side and, on the basis of responses from the receiver, adaptively transmits additional data which increase the resilience of the overall transmission. In practice, the mobile radiocommunication network is often set up in such a way that every tenth received transport block which contains an FEC packet is errored (packet error rate=10%) before the HARQ process comes into effect. The packet error rate downstream of the HARQ process is significantly less, e.g., $10^{-5}$. However, the HARQ process takes time and therefore increases the latency of the data transmission.

For LTE/5G-based direct communication between transportation vehicles, in particular, for the safety scenarios, very high reliability with minimal delay (latency) is required. The HARQ process used in 3GPP was already standardized in the 3G era and has not been fundamentally changed since then.

The mode of operation of the HARQ process specified in 3GPP is explained briefly below:
  The data are coded with a turbo code with a 1/3 code rate. This turbo coder receives an input data stream at the input and forms three output data streams. The first consists of the data of the input data stream (systematic bits), while the other two are in each case formed by a convolutional encoder. The error protection data (two different convolutional codes) are thus created.
  The three streams are punctured and multiplexed. This means that only a defined selection of bits from the three streams is transmitted and the three streams are serialized into one stream.
  The result is transmitted via the air interface to the user equipment (UE), i.e., the receiving station.
  If the UE acknowledges the successful reception of the data (ACK), no further operations are initiated.
  If the UE cannot successfully decode the data, it signals this also (NACK), and various mechanisms come into play to further support the UE so that a successful decoding is nevertheless enabled if necessary.
    Method 1: "Incremental redundancy": more information is transmitted to the UE for the decoding. This is, for example, information previously extracted during the punctuation, or the repetition of systematic bits. The UE combines the previously and currently received information (e.g., through "soft combining") and restarts the decoding attempt.
    Method 2: "Chase combining": all data are repeated. The two sets of data are combined in the receiver and a further decoding attempt is started with the combined result. This method is less efficient and is chosen as a last resort.

A description of the existing HARQ process in mobile radiocommunication can be found in "Overview of ARQ and HARQ in Beyond 3G Systems" by Cipriano, Gagneur, Vivier and Sezginer in 2010 IEEE 21st International Symposium on Personal, Indoor and Mobile Radio Communications Workshops.

Efforts to introduce the known mobile radiocommunication systems for transportation vehicle communication led to the observation that these systems are more severely challenged in terms of the required reliability. A problem exists, particularly in terms of the latency of the data transmissions. The disclosed embodiments seek to improve the existing HARQ process in terms of the reliability of the data transmissions with the primary focus on improving the latency of the data transmission. This is important, particularly for the adaptation of future 5G mobile radiocommunication systems for direct communication between transportation vehicles.

This is achieved by a method for transmitting data via a disrupted radio channel, a receiving unit and a transmitting unit.

In the extended HARQ process (referred to below as the HARQ+ process), the receiving station transmits additional feedback information along with the ACK/NACK signal. This additional information is intended to indicate which of the two decoders which cooperatively evaluate an error protection code is more severely challenged in the decoding. This offers the benefit that, by this additional information, the method according to Method 1 (incremental redundancy) is better adapted to the current case and can be better tailored for the UE and the current case. As a result, the likelihood of successful decoding in the UE is increased. The HARQ process thus becomes more efficient: it requires fewer attempts to make the data available to the UE. It thus makes sparing use of the channel as a resource and reduces the latency of the data transmission.

In the feedback message, i.e., the HARQ+ request message, an additional field is therefore provided in which the additional information can be recorded.

If a present-day turbo code is used in which two decoders interwork to recover the data, only one field having a width of 1 bit is additionally required in the HARQ+ request message.

To generate this additional feedback information in the receiver, the two decoders must be able to report how difficult the decoding task was. This task is accomplished in most decoders by the Viterbi algorithm. This algorithm searches for the most likely bit sequence and calculates a path metric for this bit sequence to make this decision. The path with the smallest accumulated metric=path metric is chosen. These path metrics can serve as a criterion indicating how severely the decoder was challenged. By a comparison of the path metrics which were calculated in the two decoders, it becomes simply possible to determine which of the decoders had more difficulties in the decoding. It is therefore assumed in this exemplary embodiment that the decoder which calculated the greater path metric had the greater difficulties.

It is beneficial for the disclosed receiving unit if it has a processor as well as the decoder unit with a number of decoders, and the processor determines which decoder had the greatest difficulties in decoding the received data symbol. The processor then initiates the transmission of an extended HARQ request message, referred to below as an HARQ+ request message, with which the transmitter side is informed which decoder had the greatest difficulties in decoding the received data symbol. The receiving unit has a corresponding communication module for this purpose.

It is beneficial for the disclosed transmitting unit if, along with the encoding unit, it has a processor which evaluates a received extended HARQ request message with which a receiving station requests even more redundancy for the data symbol. The processor then initiates the retransmission of the data symbol, wherein more error protection data are provided in the data symbol in a targeted manner in the retransmission at least by the encoder which was characterized in the HARQ+ request message as the decoder with the greatest decoding difficulties. The transmitting unit has a corresponding communication module for this purpose. In the retransmission, more error protection data are inserted by the transmitting unit into the data symbol for the at least one affected decoder than is provided according to the normal HARQ process for this operation.

In at least one disclosed embodiment of the transmitting unit, at the beginning of the transmission of a data symbol, the encoding unit already creates a plurality of versions of the data symbol which are retained for the extended HARQ process, wherein the error protection is successively increased for each decoder in the different versions.

The present description illustrates the principles of the disclosure. It is thus obvious that persons skilled in the art will be able to devise different arrangements which are not explicitly described here, but which embody principles of the disclosure and are similarly intended to be protected within its scope.

Figure 1:
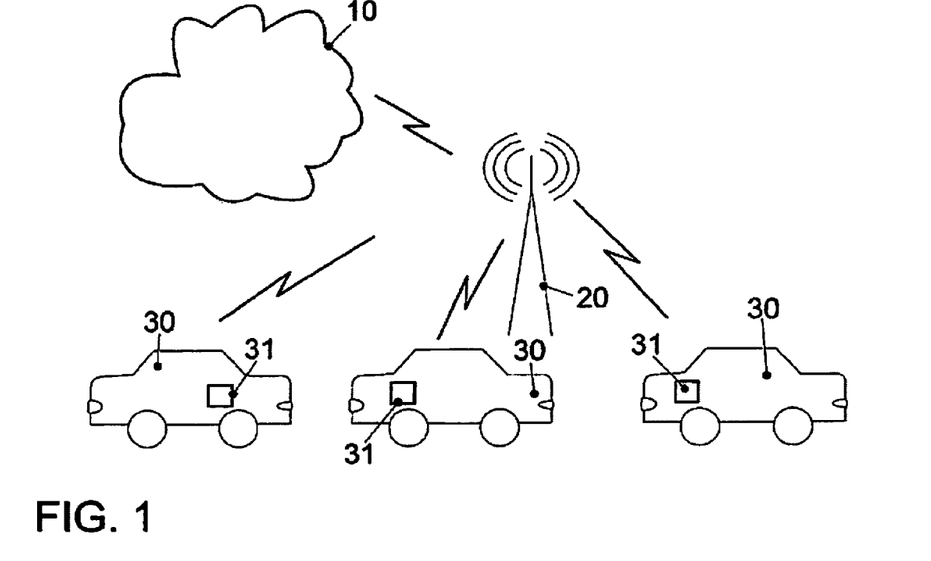
FIG. 1 shows the principle of transportation vehicle communication via mobile radiocommunication.

FIG. 1 shows the principle of transportation vehicle communication by mobile radiocommunication. Transportation vehicles are denoted with reference number 30. They are equipped in each case with an on-board unit 31 which serves as a transceiver unit for the mobile communication. All messages from the transportation vehicles (uplink) and to the transportation vehicles (downlink) are either routed via a base station 20 which serves a mobile radio cell or, in the case of direct transportation vehicle communication (sidelink), are exchanged directly between the transportation vehicles. If the transportation vehicles are located inside this mobile radio cell, they are registered with or logged in to the base station 20. If they leave the mobile radio cell, they are transferred to the adjacent cell (hand over) and are deregistered or logged off from the base station 20. The base station 20 also provides access to the Internet 10 so that the transportation vehicles 30 or all other mobile radiocommunication users in the mobile radio cell are supplied with Internet data.

These technologies are standardized and reference is made in this respect to the corresponding specifications of mobile radiocommunication standards. Reference is made to the 3GPP initiative and the LTE (Long Term Evolution) standard as a modern example of a mobile radiocommunication standard. Many of the associated ETSI specifications are currently available in version 13. The following can be cited as an example: ETSI CTS 136 213 V13.0.0 (2016-05);

Evolved Universal Terrestrial Radio Access (E-UTRA);
Physical layer procedures
(3GPP TS 36.213 version 13.0.0 Release 13).

A plurality of error protection measures are specified in the LTE standard: for the channel coding, such as, e.g., a 24-bit CRC check code for the error detection in transport blocks, and the use of a forward error correction code (FEC) based on a powerful turbo code.

A transport block consists of the useful data, wherein, by definition according to the LTE standard, a maximum number of 6144 bits of useful data can be accommodated in the transport block, the error correction data FEC and the 24-bit CRC check code. A transport block without the CRC check code corresponds to an FEC block, i.e., contains a block of useful data which is protected with forward error correction data. Reference is made in this respect explicitly to the corresponding part of the LTE standard with regard to the disclosure. This part reads: ETSI TS 136 212 V13.1.0 (2016-04); LTE; Evolved Universal Terrestrial Radio Access (E-UTRA); Multiplexing and channel coding (3GPP TS 36.212 version 13.1.0 Release 13).

Transport blocks are FEC-encoded in the encoder on the transmitter side and the transport blocks are FEC-decoded in the decoder on the receiver side. The FEC encoding of transport blocks is carried out in accordance with the LTE standard with a turbo code. A turbo code uses convolutional codes and an intermediate interleaver. A turbo code appears as a block code, i.e., in which the useful data are collected in a block separated from the error protection data.

Figure 2:
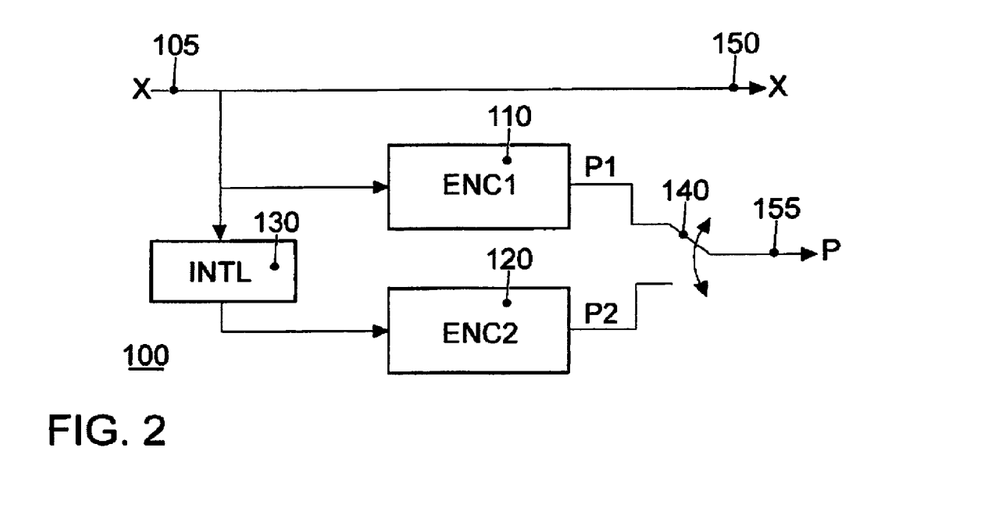
FIG. 2 shows a block diagram of a turbo encoder.
Figure 8:
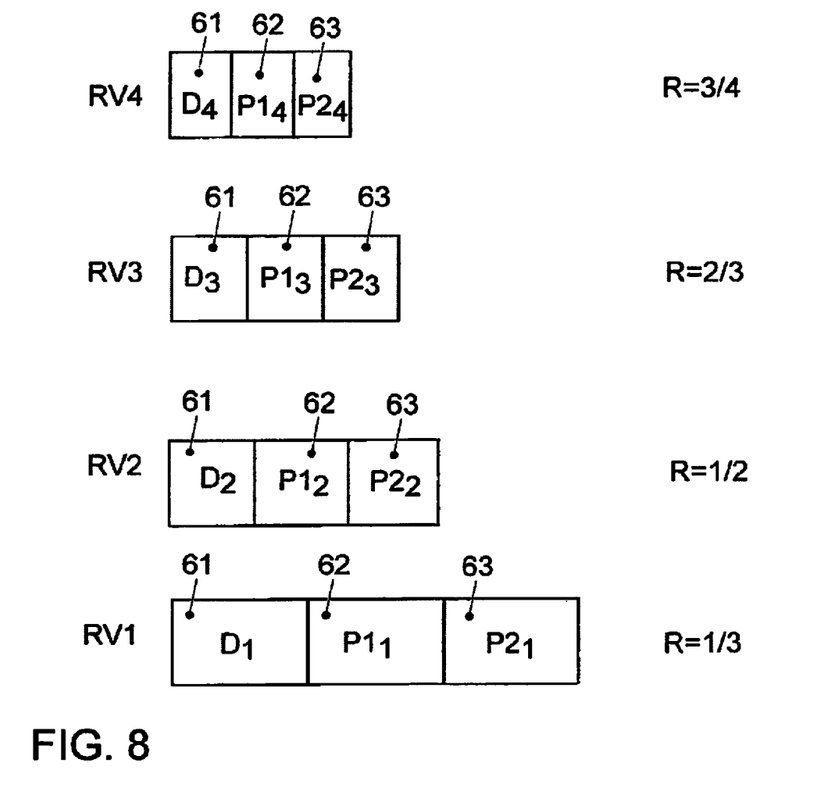
FIG. 8 shows the formats of different versions of a coded data block provided with error protection for the existing HARQ process, wherein the redundancy of the data, i.e., the error protection, increases from top to bottom.

FIG. 2 shows the basic structure of a turbo encoder 100. The useful data X to be coded are present at the input 105. In systematic encoding, these useful data X also reappear at the output 150 in unchanged form. The useful data are encoded in a first convolutional encoder 110. The generated data at the output correspond to error protection data=parity bits P1. The useful data X are also fed to an interleaver 130 which interleaves the useful data, i.e., combines associated useful data with other useful data to reduce the effects of block errors. The data output by the interleaver 130 are fed to a second convolutional encoder 120 which is arranged parallel to the first convolutional encoder 110. This encoder creates a second set of error protection data=parity bits P2. Both sets of error correction data are fed alternately via a switch 140 to the second output 155. The useful data X, the first error protection data P1 and the second error protection data P2 therefore appear in each case "en bloc" in multiplexed form at the output of the encoder 100. In anticipation of FIG. 8, it is already mentioned at this point that FIG. 8 shows different options of the packet format, such as the encoded data, but appearing following punctuation at the output of the encoder 100.

The great benefit of the turbo codes is that the decoder operates iteratively and thereby enables significantly lower error rates than conventional convolutional codes.

Reference is made to the already cited LTE specification ETSI TS 136 212 for further details of the turbo coder used in LTE.

Figure 3:
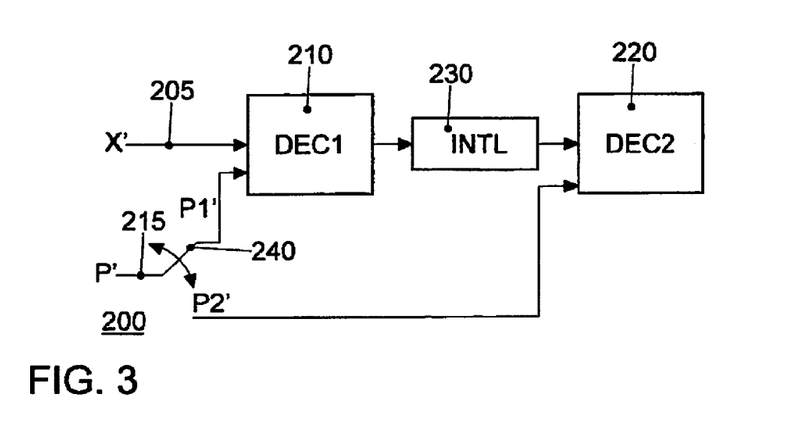
FIG. 3 shows a block diagram of a corresponding turbo decoder and its mode of operation during the initialization phase.

FIG. 3 shows a block diagram for the decoder 200 which is provided at the receiving end and is intended to evaluate the turbo code. FIG. 3 shows the data feed to the two serially connected convolutional decoders 210 and 220. The convolutional decoder 210 evaluates the convolutional code P1' 240 and the convolutional decoder 220 evaluates the convolutional codes P2'. The broken-line marking of X, P1 and P2 indicates that the corresponding data may be errored. The convolution decoder 210 is supplied 205 with the received useful data X' in the order of their input, whereas the convolutional decoder 220 receives the useful data decoded by the decoder 210 in interleaved order. The interleaver 230 is provided between the decoders 210 and 220 for this purpose. As a result, the decoded data bit of X' and P1' is present at the decoder 220 at the same time as the associated P2' bit which is applied via the switch 215 to the input of the decoder 220.

Figure 4:
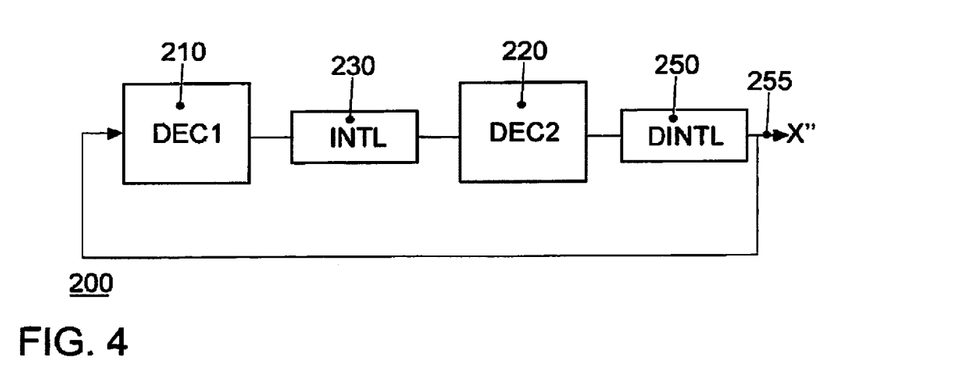
FIG. 4 shows a block diagram of a turbo decoder and its mode of operation during the received data decoding phase.

FIG. 4 shows the mode of operation of the decoder unit 200 following initialization. The individual decoders 210 and 220 in each case execute, for example, the Viterbi algorithm. They determine the most likely sequence which corresponds most closely to the received errored data bits X', P1' and P2'. For all punctuated bits, the respective decoder must set the probability of 50% for the bit having the value "1" and for the bit having the value "0". This sequence is returned to the starting position in the deinterleaver 250 and is fed back to the input. The sequence thus passes through the decoder in a number of iterations, wherein the result of the estimate becomes increasingly accurate. After, e.g., 10 iterations, the result is output at the output 255. This result corresponds to the recovered useful data X". However, if the result is not error-free, this is established in the following check of the CRC check code for the transport block and the HARQ process is requested for this transport block.

Figure 5:
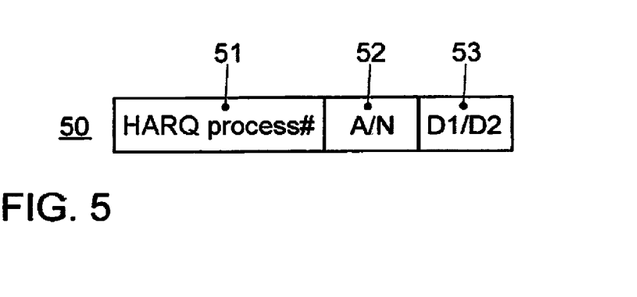
FIG. 5 shows the format of an extended HARQ request message according to a disclosed embodiment.

To do this, an HARQ request message is transmitted from the receiving unit which contains the decoder 200 back to the transmitting unit. An extended HARQ request message is transmitted according to the disclosed embodiments, the format of which is shown in FIG. 5. Along with the usual fields 51 for the HARQ process number and 52 for the ACK/NACK bit, this HARQ+ request message contains a field 53 for one or more bits that indicate which convolutional decoder 210 or 220 had the greater difficulties in decoding the input data. The decoder 200 must therefore make this information available (store it) for a time. If the decoder 200 contains only two convolutional decoders 210, 220, it therefore suffices if the field 53 in the HARQ+ request message only has a width of one bit. If more convolutional decoders are provided in the decoder, correspondingly more bits should be provided in the HARQ+ request message.

To obtain the information indicating which decoder had the greater difficulties, the characteristic feature of the Viterbi algorithm is exploited whereby a path metric is calculated by this algorithm for the defined optimum Viterbi path. In the simplest case, the value corresponds to the Hamming distance between the received data symbol and the decoded data symbol. The greater this value is, the more errored the received data symbol will be and the more difficulties the convolutional decoder had in decoding the received data.

Figure 6:
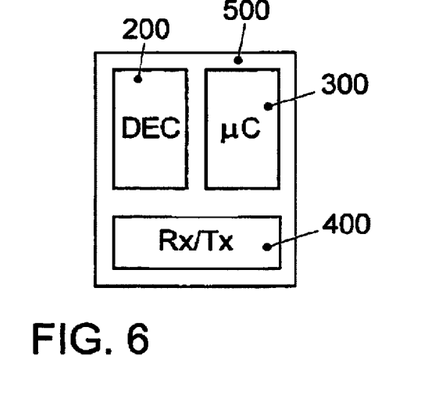
FIG. 6 shows a block diagram of a receiving unit for the disclosed transportation vehicle communication.

FIG. 6 shows a simple block diagram of a receiving unit 500. This consists of a decoder 200, a communication module 400 and a microcontroller 300. The necessary memory is contained in each case in the decoder 200, the communication module 400 and the microcontroller 300. A receiving unit 500 of this type can be used together with a corresponding transmitting unit as an on-board unit 31 in the transportation vehicles 30. The transmitting unit is explained later in the description of FIG. 10. These units, on the one hand, receive data from the base station 20 (downlink) and, on the other hand, transmit data to the base station (uplink) or receive and/or transmit data from/to the other transportation vehicles (sidelink).

Figure 7:
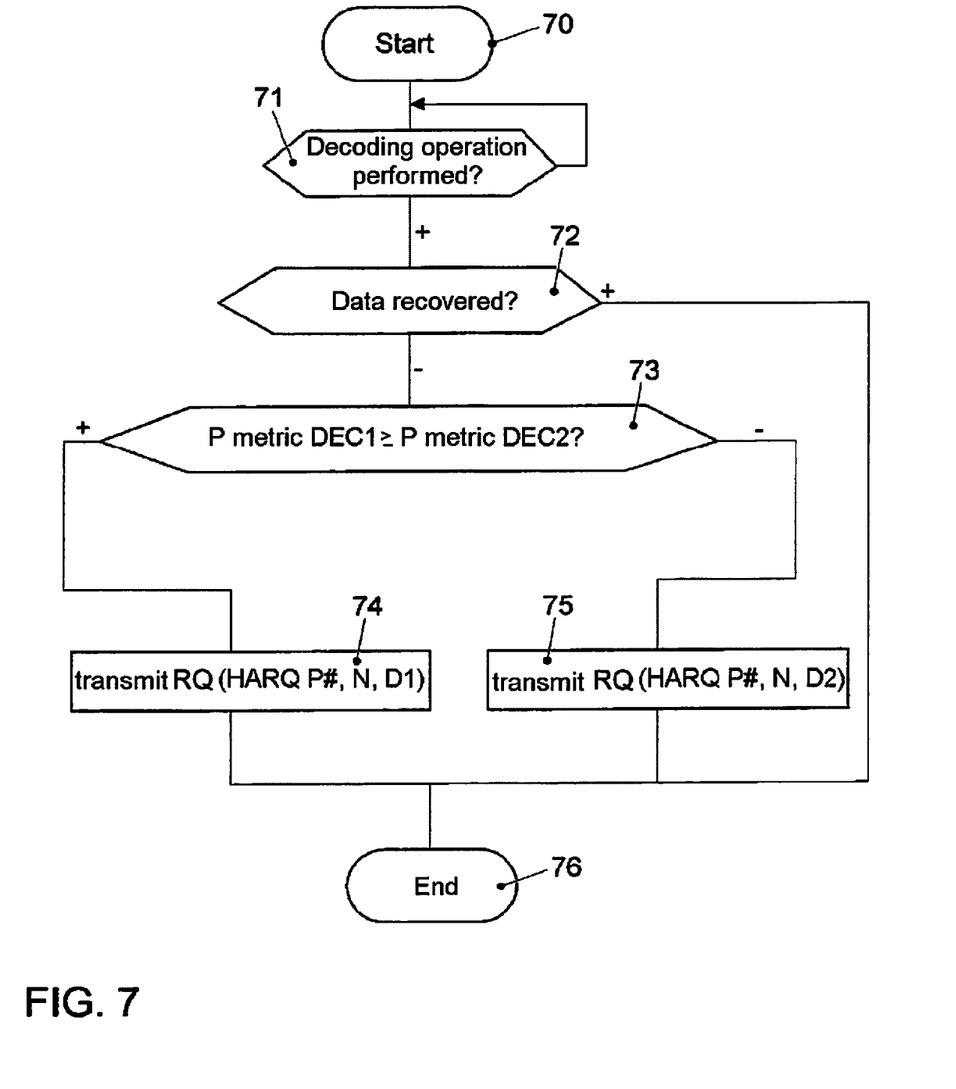
FIG. 7 shows a flow diagram for a program executed by the processor in the disclosed receiving unit.

The receiving unit 500 forms the HARQ+ request message. This is done using the microcontroller 300. The microcontroller operates according to a program whose flow diagram is shown in FIG. 7. The program begins in program operation at 70. In operation at 71, the program waits for the finished decoding of the input data sequence of the decoder 200. If that is the case, including the checking of the CRC check code, a check is carried out in query 72 to determine whether the data could be recovered without error. If so, the program ends in operation at 76. If the data could not be recovered without error, the convolutional decoder 210, 220 which had the greater difficulties in decoding the turbo code is determined in query 73. The path metrics calculated in the convolutional decoders are compared with one another for this purpose. If the path metric calculated by the convolutional decoder 210 is greater, this decoder had the greater decoding difficulties. In that case, the microcontroller 300 forms the HARQ+ request message in program operation at 74, with the entry that the decoder 210 is indicated in bit field 53. In this case, the bit for the negative acknowledgement NACK is set in field 52. The matching HARQ process number is similarly recorded in field 51. If the path metric calculated by the convolutional decoder 220 is greater, this decoder had the greater decoding difficulties. In that case, the microcontroller 300 forms the HARQ+ request message in program operation at 75 with the entry that the decoder 220 is indicated in bit field 53. The program thus ends in operation at 76. Alternatively, other/extended methods can be used to determine which decoder had the greater decoding difficulties. One method would entail the embedding of pilot symbols, the content of which is already known to the receiver. Here, the receiver could observe which decoder makes a greater contribution to the successful decoding of this information (progress observation) throughout the iterations. The decoders with the smaller amount are more severely challenged.

FIG. 8 shows how the normal HARQ process takes place in the LTE standard. The transmitting station first sends a transport block with low redundancy. As described, a turbo code is used for the FEC encoding. A transport block therefore consists of a number of useful data D and the error protection data P1 and P2. At the beginning, the encoder 100 calculates the code with a code rate of R=1/3; i.e., it generates three bits, i.e., the useful data bit and two parity bits, from one useful data bit. This simultaneously represents the version RV1 with the greatest redundancy. The corresponding FEC block is shown at the bottom in FIG. 8 and contains the useful data D1 in field 61 and the associated parity bits P11 and P21 in fields 62 and 63.

The versions with lower redundancy (Redundancy Version) RV2 to RV4 are obtained through punctuation from version RV1. Punctuation is a process in which individual bits are omitted from the coded data of version RV1. In each case, this is done according to a punctuation scheme which must also be known on the receiver side. For this purpose, the microcontroller 300 also counts on the receiver side which redundancy version has just been received. The version with the least redundancy corresponds in FIG. 8 to version RV4. The transport block is transmitted as shown therein with code rate R=3/4. The data transmission of the transport block then starts in the exemplary embodiment chosen here. If the block could not be decoded without error, block RV3 is transmitted next according to the existing HARQ process with code rate R=2/3. The redundancy for both convolutional decoders 210 and 220 is simultaneously increased therein. If the decoding process fails once more, version RV2 is transmitted in the next operation in which the transport block is transmitted with code rate R=1/2. If the decoding process fails once more, the transport block is finally transmitted without punctuation of the data with code rate R=1/3. As described, the code rate is successively reduced during the HARQ process. The redundancy is increased evenly in each operation for each of the two convolutional decoders.

According to the extended HARQ process, the redundancy increase is tailored for each operation for the convolutional decoder 210, 220 which had the greatest decoding difficulties in the preceding operation. To do this, following the first transmission of the FEC block in version RV4 with the code rate R=3/4, according to FIG. 9 version RV9 is transmitted if it has been notified that the first convolutional coder 210 had the greater problem, or version RV8 is transmitted if it was signaled in the HARQ+ request message 50 that the convolutional decoder 220 had the greater problem in the decoding. As shown, a considerable redundancy increase is set for the decoder concerned, whereas the other decoder undergoes no increase. In the shown case of RV9, the first convolutional decoder 210 receives the data transmitted without punctuation, i.e., already with the highest redundancy level. The useful data D4 are transmitted as before with the same punctuation. The second convolutional decoder 220 must then operate once more with the already previously transmitted redundancy data P24. In the case of RV8, the ratios are inverted, wherein the second decoder receives the full redundancy data and the first convolutional decoder must operate with the previously transmitted redundancy data P14. The benefit is that the decoder with the greatest decoding difficulties receives the full redundancy data in a repeated transmission of the transport block, wherein the transport block itself is not longer than the transport block of the first repetition (retransmission) according to the conventional HARQ process. Since both convolutional decoders cooperatively evaluate the code, the result of the second convolutional decoder is also improved if the first convolutional decoder has to contend with fewer decoding difficulties. The latency of the data transmission is thereby reduced as a whole.

Figure 9:
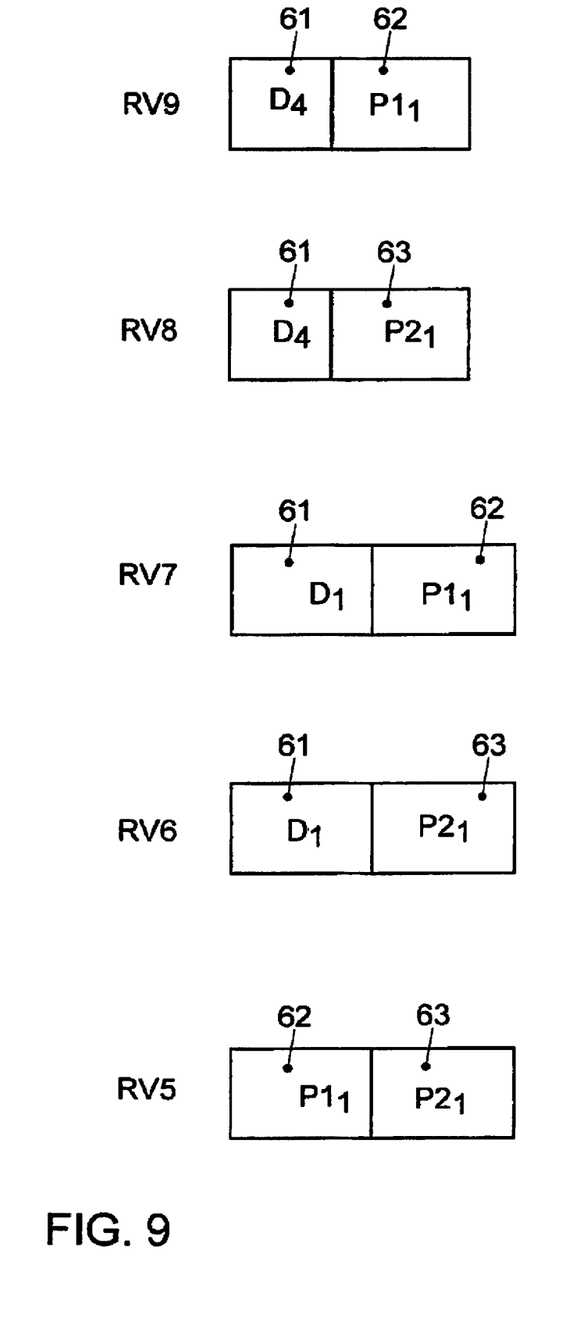
FIG. 9 shows the formats of further versions of a coded data block provided with error protection for the extended HARQ process, wherein the redundancy of the data, i.e., the error protection, increases from top to bottom.

If the block could not yet be correctly recovered following the second iteration, and if the convolutional decoder 220 now has the greater problem with the decoding of the data, version RV8 is transmitted in the third transmission of the transport block, whereby the convolutional decoder 220 receives the full parity data P21 (without punctuation).

If the block could then still not be recovered without error, version RV7 or RV6 is transmitted, depending on which decoder had the greater difficulties. Along with the full redundancy data P11 or P21, the systematic useful data bits D1 without punctuation, i.e., similarly complete, are contained therein.

Version RV5 is still available as an alternative. The convolutional codes P1 and P2 of the two convolutional decoders 210 and 220 are contained therein, complete without punctuation. However, no useful data bits are transmitted in this option. This option can be transmitted in the HARQ+ process if it is established following the first transmission that both convolutional decoders 210, 220 have the same difficulties with the decoding of the FEC block.

Further options which can be used instead of or in addition to the described options in the HARQ+ process are also conceivable. Any option in which more redundancy data are transmitted in the respective operation for a convolution decoder than in versions RV3 and RV2, optionally with the same block length, should similarly be usable.

Figure 10:
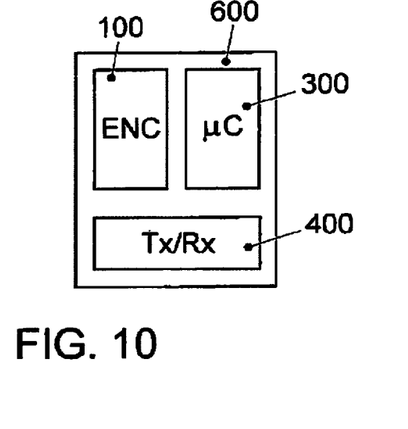
FIG. 10 shows a block diagram of a transmitting unit for the disclosed transportation vehicle communication.

FIG. 10 shows a simple block diagram of a transmitting unit 500. This consists of an encoder 100, a communication module 400 and a microcontroller 300. The necessary memory is contained in each case in the encoder 100, the communication module 400 and the microcontroller 300.

Figure 11:
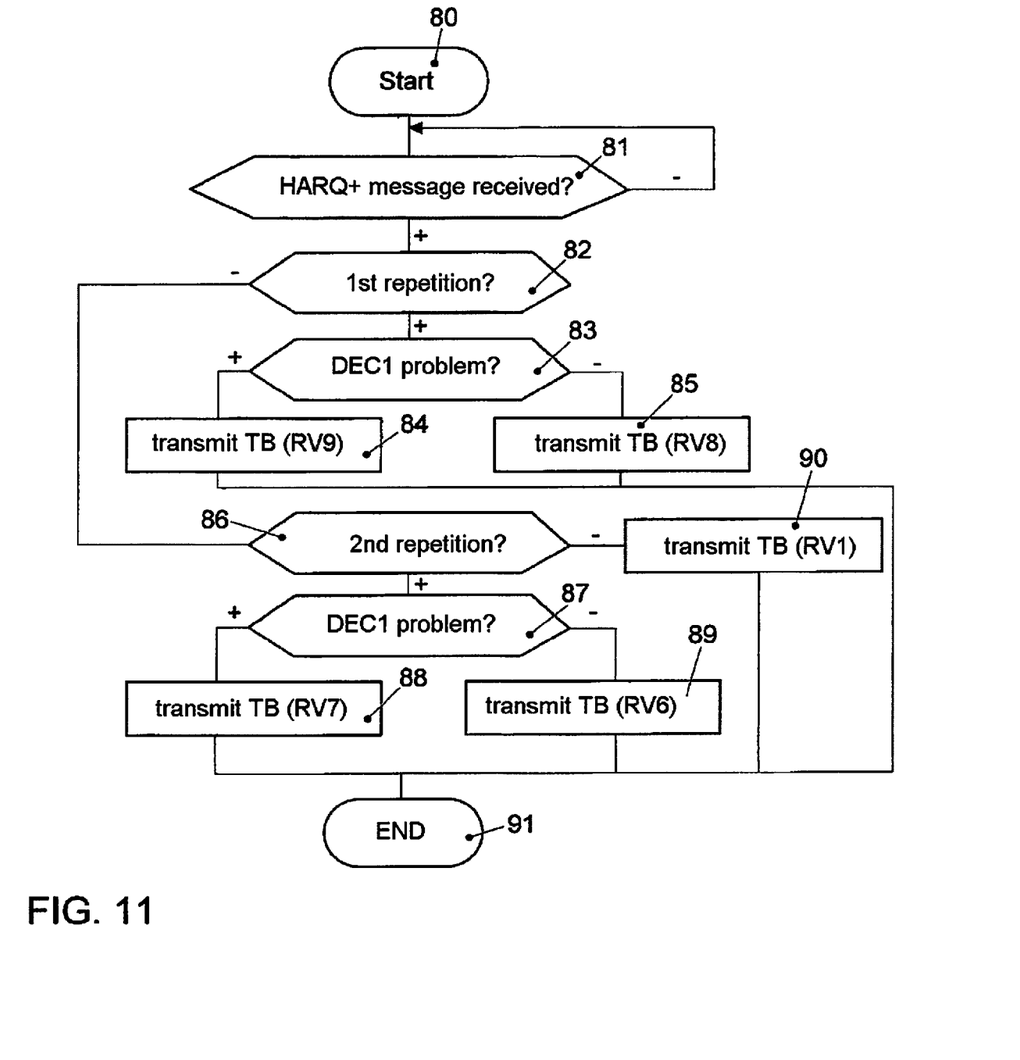
FIG. 11 shows a flow diagram for a program executed by the processor in the disclosed transmitting unit.

The mode of operation of the microcontroller 300 and the transmitting unit 600 will now be explained with reference to FIG. 11. This program is executed for the implementation of the HARQ+ process. The program starts in program operation at 80. In query 81, the receipt of an HARQ+ request message is awaited. If an HARQ+ request message has been received, a check is carried out in query 82 to determine whether this is the first request in the HARQ+ process. To do this, a counter must be set in the microcontroller with each receipt of an HARQ+ request message, the counter being reset at the end. If this is the first request, a check is carried out with query 83 to determine whether the convolutional decoder 210 was signaled as problematic in the request message. If so, the transport block is retransmitted in program operation at 84 in the HARQ+ process with the FEC block in option RV9. Otherwise, a transport block is transmitted in operation at 85 with the FEC block in option RV8 to support the convolutional decoder 220. If this is not the first request in the HARQ+ process, a check is carried out in operation at 86 to determine whether it is the second request in the HARQ+ process. If so, a check is carried out in operation at 87 to determine whether the convolutional decoder 210 was signaled as problematic in the request message. If so, the transport block is retransmitted in program operation at 88 in the HARQ+ process with the FEC block in option RV7. Otherwise, a transport block is transmitted in operation at 89 with the FEC block in option RV6 to support the convolutional decoder 220. If this is not the second request message in the HARQ+ process, the transport block is transmitted immediately after query 86 with the FEC block according to option RV1. This corresponds to program operation at 90. The program then ends in operation at 91.

It should be understood that the proposed method and the associated apparatuses can be implemented in different forms of hardware, software, firmware, special processors or a combination thereof. Special processors may be Application-Specific Integrated Circuits (ASICs), Reduced Instruction Set Computers (RISC) and/or Field Programmable Gate Arrays (FPGAs). The proposed method and the apparatus may be implemented as a combination of hardware and software. The software may be installed as an application program on a program memory apparatus. This is typically a machine based on a computer platform which has hardware, such as, for example, one or more central units (CPUs), a random access memory (RAM) and one or more input/output (I/O) interfaces. An operating system is furthermore typically installed on the computer platform. The different processes and functions that have been described here may form part of the application program, or a part which is executed via the operating system.

The disclosure is not limited to the embodiments described here. There is scope for different adaptations and modifications which the person skilled in the art would consider on the basis of his technical knowledge as also being associated with the disclosure.

The invention claimed is:

1. A method for transmitting data via a disrupted radio channel, the method comprising:

transmitting the data with error protection data as forward error correction data, wherein, in a use of the error protection data, a number of decoders cooperatively recover useful data on a receiver side by evaluating the error protection data, wherein a number of error protection data is successively increased according to an existing Hybrid Automatic Repeat Request (HARQ) process in response to the radio channel being so disrupted that the transmitted data is not recoverable despite the error protection data, in an extended HARQ (HARQ+) process, the receiver side transmitting to a transmitter side, an HARQ+ request message that identifies which of the receiver side decoders had greatest difficulties in recovering the useful data, and in response, the transmitter side transmitting more error protection data targeted at least to the identified receiver side decoder than was provided according to the existing HARQ process.

2. The method of claim 1, wherein, for the identification of which of the receiver side decoders had the greatest difficulties in recovering the useful data, an additional field is provided for a number of bits in the HARQ+ request message.

3. The method of claim 1, wherein, for a channel coding of the useful data, a turbo code is used which is generated on the transmitter side in an encoder unit with at least two parallel operating convolutional encoders, wherein, for the transmission of the data, a data packet is assembled in which useful data, error protection data of the first convolutional encoder and error protection data of the at least one second convolutional encoder follow one another in multiplexed form.

4. The method of claim 3, wherein a decoder unit is provided on the receiver side to decode the useful data, the decoder being equipped with at least two serially operating convolutional decoders to which the useful data and the error protection data associated with the useful data are fed.

5. The method of claim 3, wherein only one field having a 1-bit width is provided in the HARQ+ request message in response to a turbo code being generated with two convolutional encoders.

6. The method of claim 5, wherein path metrics which indicate which turbo code word is most likely to be represented by a received data are calculated in convolutional decoders on the receiver side, and wherein the decision as to which of the convolutional decoders had the greatest difficulties in recovering the useful data is based at least on which of the convolutional decoders calculated a greatest path metric.

7. A receiving unit for use in a method for transmitting data via a disrupted radio channel, the receiving unit comprising:
a decoding unit with a number of decoders which cooperatively decode a received data symbol,
a communication module, and
a processor configured to determine which decoder had greatest difficulties in decoding the received data symbol, and to initiate a transmission of an HARQ+ request message, with which a transmitting side is notified which decoder had the greatest difficulties with the decoding of the received data symbol.

8. The receiving unit of claim 7, wherein the decoding unit has at least two convolutional decoders and the at least two convolutional decoders calculate path metrics which indicate which code word is most likely to be represented by the received data symbol.

9. The receiving unit of claim 8, wherein the processor carries out a comparison of the calculated path metrics and identifies the convolutional decoder whose calculated path metric has a greater value as the one with the greatest difficulties to determine which convolutional decoder had the greatest difficulties in decoding the received data symbol.

10. The receiving unit of claim 7, wherein the processor records information relating to the convolutional decoder with the greatest decoding difficulties in an additional field with a number of bits in the HARQ+ request message.

11. The receiving unit of claim 10, wherein the processor inserts a 1-bit field as an additional field into the HARQ+ request message where the decoding unit is equipped with only two convolutional decoders.

12. A transmitting unit for use in a method for transmitting data via a disrupted radio channel the transmitting unit comprising:
an encoding unit with a number of encoders which encode a data symbol to be transmitted by generating dedicated error protection data,
a communication module; and
a processor which operates so a number of error protection data in the data symbol according to an existing Hybrid Automatic Repeat Request (HARQ) process is successively increased in response to the radio channel being so disrupted that the transmitted data is not recoverable despite the error protection data, wherein the processor evaluates an extended HARQ (HARQ+) request message with which a receiving station requests a retransmission of the data symbol according to an extended HARQ process, and initiates the retransmission of the data symbol, wherein more error protection data provided in the data symbol in the retransmission targeted at least to the decoder which was characterized in the HARQ+ request message as the decoder with the greatest decoding difficulties, wherein, in the retransmission, the transmitting unit inserts more error protection data into the data symbol targeted to the decoder, which was characterized in the HARQ+ request message as the decoder with the greatest decoding difficulties, than is provided according to the existing HARQ process.

13. The transmitting unit of claim 12, wherein the encoding unit creates a plurality of versions of the data symbol at the beginning of the transmission of the data symbol, said versions being retained for the extended HARQ process, wherein the error protection data is successively increased in the different versions.

* * * * *